(12) United States Patent
Huang et al.

(10) Patent No.: US 6,693,352 B1
(45) Date of Patent: Feb. 17, 2004

(54) CONTACT STRUCTURE FOR GROUP III-V SEMICONDUCTOR DEVICES AND METHOD OF PRODUCING THE SAME

(75) Inventors: Wingo Huang, San Jose, CA (US); Youming Li, San Jose, CA (US)

(73) Assignee: Emitronix Inc., Cupertino, CA (US)

( * ) Notice: Subject to any disclaimer, the term of this patent is extended or adjusted under 35 U.S.C. 154(b) by 9 days.

(21) Appl. No.: 09/587,014

(22) Filed: Jun. 5, 2000

(51) Int. Cl.$^7$ .............................................. H01L 29/40
(52) U.S. Cl. ......................... 257/743; 257/744; 257/99
(58) Field of Search .................. 257/743, 744, 257/745, 99

(56) References Cited

U.S. PATENT DOCUMENTS

| | | | |
|---|---|---|---|
| 6,078,064 A | 6/2000 | Ming-Jiunn et al. | 257/103 |
| 6,121,127 A | 9/2000 | Shibata et al. | 438/604 |
| 6,204,512 B1 | 3/2001 | Nakamura et al. | 257/13 |

OTHER PUBLICATIONS

"Low Resistance Ohmic Contacts on Wide Band–Gap GaN", M.E. Lin, Z. Ma, F.Y. Huang, Z.F. Fan, L.H. Allen, and H. Morkoç, American Institute of Physics (Feb. 1994).
"Metal Contacts to Gallium Nitride", J.S. Foresi and T.D. Moustakas, American Institute of Physics (May 1993).
"Use of InN for Ohmic Contacts on GaAs/AlGaAs Heterojunction Bipolar Transistors", F. Ren, C.R. Abernathy, S.N.G. Chu and J.R. Lothian, S.J. Pearton, American Institute of Physics (Mar. 1995).
"Indium Tin Oxide Ohmic Contact to Highly Doped N–GaN", J.K. Sheu, Y.K. Su, G.C. Chi, M.J. Jou, C.C.Liu, C.M. Chang, Solid–State Electronics 43 (1999).
MRS Internet J. Nitride Semicond. Res. 4S1, G9.9, E. Kaminska, A. Piotrowska, J. Jasinski, J. Kozubowski, A. Barcz, K. Golaszewska, D.B. Thomson, R.F. Davis, M.D. Bremser.
MRS Internet J. Nitride Semicond. Res. 4S1, G6.42 (1999), R.W. Chugang, A.Q. Zou, and H.P. Lee.
"GaN: Processing, Defects, and Devices", S. J. Pearton, J.C. Zolper, R.J. Shul, f. Ren, Journal of Applied Physics, vol. 86, No. 1 (Jul. 1999).
"Growth of InN GaAs Substrates by the Reactive Evaporation Mehtod", Yuichi Sato and Susumu Sato, Japanese Journal of Applied Physics, vol. 28, No. 9 (Sep. 1989).
"Fundamental Absorption Edge in GaN, InN and Their Alloys", Kozo Osamura, Kazuo Nakajima and Yotaro Murakami, Solid State Communications, vol. 11, No. 5 (Sep. 1972).

*Primary Examiner*—Sara Crane
(74) *Attorney, Agent, or Firm*—Anthony Delas

(57) ABSTRACT

A contact structure for group III–V and group II–VI compound semiconductor devices, generally used as a light emitting diode (LED), a laser diode (LD), or a photodiode (PD), comprising p-type and/or n-type conduction is disclosed. The contact structure comprises a stack of multiple layers of metals and transparent conducting oxide. The first layer of the contact structure is in direct contact to the semiconductor and comprises at least one of indium, tin, nickel, chromium and zinc, or an alloy or combination of layers thereof. The second layer of the structure is in direct contact to the first layer and comprises at least one of Indium Tin Oxide, Indium oxide, and Tin oxide, or a combination thereof. The optional third layer of the structure contacts the second layer and comprises at least one of Au, Al, Pt, Pd, Mo, Cr, Rh, Ti. The third layer may be a contact pad contacting a smaller portion of the second layer. A preferred thermal anneal of one or more layers of the contact structure further improves semiconductor device performance.

54 Claims, 5 Drawing Sheets

CONTACT STRUCTURE FOR GROUP III-V SEMICONDUCTOR DEVICES AND METHOD OF PRODUCING THE SAME

BACKGROUND OF THE INVENTION

1. Field of Invention

The invention relates to a contact structure for compound semiconductor device, and particularly to a group III-V compound semiconductor device generally used as a light emitting diode (LED), a laser diode (LD), or a photodiode (PD), and more specifically to a contact structure for group III-nitride, group III-phosphide, and group III-arsenide based LED, LD, and PD. The compound semiconductors satisfy the following general formula: $Al_xGa_yIn_{1-x-y}N$, wherein $0<=x<=1$, $0<=y<=1$, and $0<=x+y<=1$ inclusive; $Al_xGa_yIn_{1-x-y}As_zP_{1-z}$, wherein $0<=x<=1$, $0<=y<=1$, $0<=x+y<=1$, $0<=z<=1$ inclusive.

2. Description of the Related Art

Group III-V compound semiconductors have been used to make many electro-optic and opto-electronic devices including LED, LD, and PD. For these devices, in addition to the desire to have good crystal quality, it is recognized in the invention that there is a desire to have contact electrodes with both low contact resistance to the semiconductor and a conductive layer having low sheet resistance substantially over the area of the semiconductor. Lower contact resistances allow reduced energy dissipation at the contact region. Lower sheet resistances ensure an even spreading of current in the lateral direction of the semiconductor surface such that substantially the entire active region of the device may be utilized. When III-V compound semiconductors are used for such light-sensitive devices as LED, LD, and PD, the spread out conductive layer of the contact should also allow light emitted in the active region to propagate out of the device by substantially passing through the layer with minimum loss. It is desired then to have a contact structure for allowing substantially the entire active region of the semiconductor to be utilized for light emission, while still allowing the generated light to escape from being blocked or absorbed by the contact as it tries to exit the device.

There exist techniques directed toward providing devices having characteristics in accord with the desired features briefly described above, i.e., low contact and sheet resistance, and high transmission efficiency of generated radiation, and solving recognized contact problems for group III-V semiconductor LED. In one reference, Shibata Naoki, et. al., at U.S. Pat. No. 6,008,539, disclose an electrode structure for a GaN based compound semiconductor LED. FIG. 1 of the present application schematically illustrates one of the structures described by Naoki et al. Referring then to FIG. 1, an LED structure is shown including a sapphire substrate 1, an AlN buffer layer 2, a Si-doped $n^+$-type GaN layer 3, an undoped n-type AlGaN layer 4, a Mg-doped GaN active layer 5, a Mg-doped p-type AlGaN layer 6, a highly Mg-doped $p^+$-type GaN layer 7, and a double layer (Ni/Au) electrode 8A which contacts the top $p^+$-layer 7, and an electrode 8B which contacts the $n^+$-type layer 3. Naoki et al. explain that the layer 8A contacting the $p^+$-type layer 7 acts as a contact electrode with low contact resistance and sheet resistance. However, the device shown at FIG. 1 and described by Naoki et al in the '539 patent does not have good optical transparency, and therefore, exhibits poor LED light output efficiency. Even if the Ni/Au stack layer thickness is as thin as 40 Angstroms/40 Angstroms, the contact electrode still absorbs approximately 40% of the light generated, as estimated by R. W. Chuang et. al. in a similar LED structure published in MRS Internet Journal of Nitride Semiconductor Research, 4S1, G6.42 (1999), incorporated by reference below.

In another related art reference, Biing-Jye Lee, et. al., at U.S. Pat. No. 6,057,562, disclose a layer structure for a group III-V compound semiconductor AlGaInP LED. As schematically illustrated at FIG. 2 of the present application, the LED structure proposed by Lee et al. includes a back contact 50 on a substrate 52 with a Distributed Bragg reflector layer 80, an active layer 54 of stacked AlGaInP, a 10 micrometer thick III-V compound semiconductor window layer 56 and an indium-tin-oxide layer 60 sandwiching a p-type semiconductor contact layer 58, and a top electrode 62. Current spreading is achieved by the combination of window layer 56 and the conductive transparent oxide layer 60, in conjunction with a highly doped p-type III-V compound semiconductor layer 58 to attempt to achieve a substantially ohmic contact between layers 56 and layer 60. Improved light output efficiency was observed by Lee et al. with this LED structure over that realized by Naoki et al. However, many additional process steps, such as metal organic vapor phase epitaxial processes, are involved for incorporating the Distributed Bragg Reflector layer 80, as well as for forming the thick window layer 56 and contact layer 58, which undesirably increase manufacturing complexity and cost

SUMMARY OF THE INVENTION

It is therefore a first object of the invention to provide a contact structure with both low contact resistance and low sheet resistance such as to utilize a substantial portion of an active region for compound semiconductor, preferably of group III-V type, LED, LD and PD devices having p-type and/or n-type conduction.

It is a second object to provide a contact structure with high optical transparency such as to efficiently transmit light generated in the active region of the device.

A third object of the present invention is to provide an efficient fabrication method for a high light output compound semiconductor LED and LD in accordance with the first and second objects.

Accordingly, a compound semiconductor LED or LD or PD is provided with a contact structure including a thin metal layer and a transparent conducting oxide layer. The thin metal layer provides a low resistance direct contact to the semiconductor and is preferably formed of at least one of Indium (In), Tin (Sn), nickel (Ni), Chromium (Cr), and Zinc (Zn), or an alloy or multilayer structure of two or more of these elements. The transparent conducting oxide layer is preferably in direct contact with the first thin metal layer and exhibits low sheet resistance for current spreading resulting in enhanced LED light output and is preferably formed of at least one of Indium Tin Oxide (ITO), Indium oxide ($InO_2$), and Tin oxide ($SnO_2$), or an alloy of two or more of these transparent conducting oxides. A conductive pad, preferably a metal, in contact with a portion of the transparent conducting oxide layer is preferably formed of at least one of Al, Au, Cr, Mo, Ni, Pt, Pd, Rh, Ta, Ti, and preferably provides a contact pad for wire-bonding or otherwise connecting the semiconductor device to external circuitry. Preferably the compound semiconductor device is either a group III-V or a group II-VI semiconductor device.

Preferably, the thin metal layer in contact with the semiconductor on one side and with the transparent conducting oxide layer on the other side is compatible with both the semiconductor and the transparent conducting oxide layer. Preferably, interdiffusion of the elements of the semiconductor-metal-transparent conducting oxide multilayer structure occurs for enhancement of the performance of the semiconductor device.

Also preferably, the semiconductor-metal-transparent conducting oxide multilayer structure is subjected to a thermal anneal process at an elevated temperature which causes alloying between the multilayer contact structure and semiconductor layer for further reduction of the contact resistance and sheet resistance, and wherein the optical transparency and adhesion of the contact are further enhanced.

DETAILED DESCRIPTION OF THE PREFERRED EMBODIMENT

The following references are hereby incorporated by reference herein as showing alternative configurations and variations that may be implemented within the spirit and scope of the invention.

1- S. J. Pearton, J. C. Zolper, R. J. Shul and F. Ren, "GaN: Processing, Defects, and Devices", Applied Physics Reviews, vol.86, no.1, July 1999.

2- E. Kaminska, A. Piotrowska, J. Jasinski et. al., "Ni/Si-Based Contacts to GaN: Thermally Activated Structural Transformations Leading to Ohmic Behavior", MRS Internet J. Nitride Semicond. Res. 4S1, G9.9 (1999).

3- R. W. Chuang, A. Q. Zou and H. P. Lee, "Contact Resistance of InGaN/GaN Light Emitting Diodes Grown on the Production Model Multi-Wafer MOVPE Reactor", MRS Internet J. Nitride Semicond. Res. 4S1, G6.42 (1999).

4- M. E. Lin, Z. Ma, F. Y. Huang et. al. , "Low Resistance Ohmic Contacts on Wide Band-Gap GaN", Applied Physics Letters vol.64, no.8, p.1003 (1994)

5- J. S. Foresi and T. D. Moustakas, "Metal Contacts on Gallium Nitride", Applied Physics Letters, vol.62, no.22, p.2859, (1993)

6- F. Ren, C. R. Abernathy et. al., "Use of InN for Ohmic Contacts on GaAs/AlGaAs Heterojunction Bipolar Transistors", Applied Physics Letters vol.66, no.12, p.1503, (1995)

7- K. Osamura K. Nakajima et. al., "Fundamental Absorption Edge in GaN, InN and their Alloys", Solid State Communications, vol.11, p.617 (1972)

8- Y. Sato and S. Sato, "Growth of InN on GaAs Substrates by Reactive Evaporation Method", Jap. J. A P., vol.28, L1641, (1989)

9- N. Shibata, J. Umezaki, et. al., "Electrodes for p-type Group III Nitride Compound Semiconductor", U.S. Pat. No. 6,008,539.

10- Biing-Jye Lee, et. al., "High Efficiency Light Emitting Diode with Distributted Bragg Reflector", U.S. Pat. No. 6,057,562

11- J. K. Sheu and Y. K. Su, "Effects of Thermal Annealing on the Indium Tin Oxide Schottky Contacts of n-GaN", Applied Physics, vol.72, no.25, p.33317, (1998)

12- J. K. Sheu, Y. K. Su, et. al., "Indium Tin Oxide Ohmic Contact to Highly-Doped n-GaN", Solid-State Electronics, vol.43, p.2081 (1999)

Figure 1:
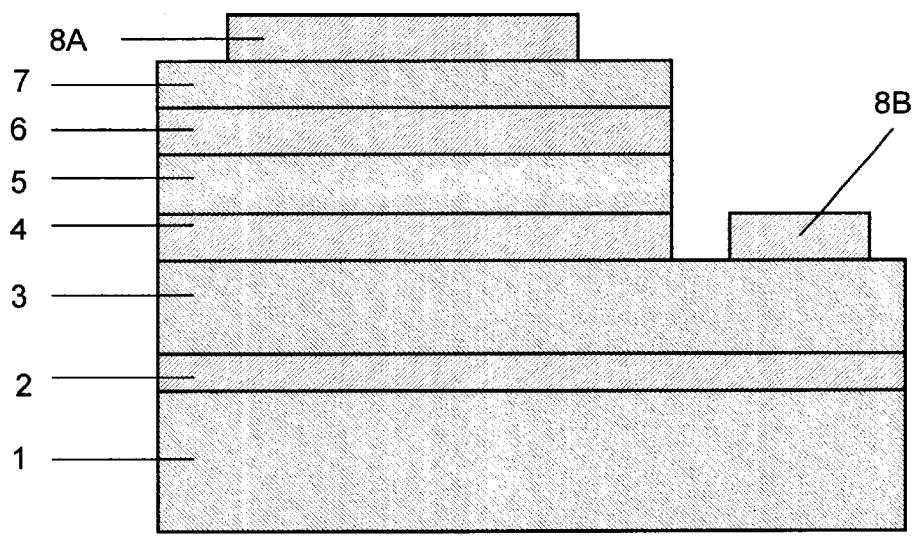
FIG. 1 schematically illustrates a cross-sectional view of a first conventional LED.
Figure 2:
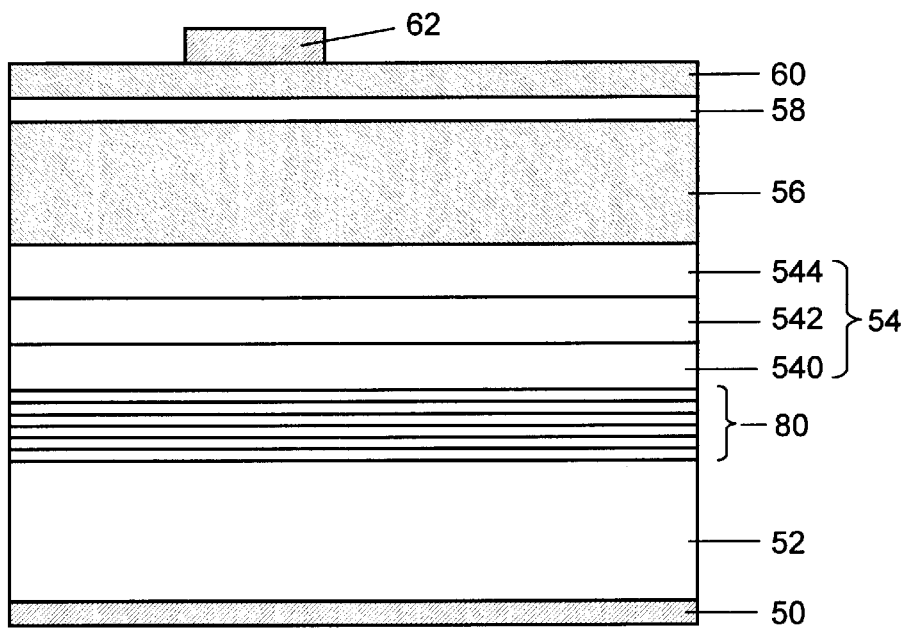
FIG. 2 schematically illustrates a cross-sectional view of a second conventional LED.
Figure 3:
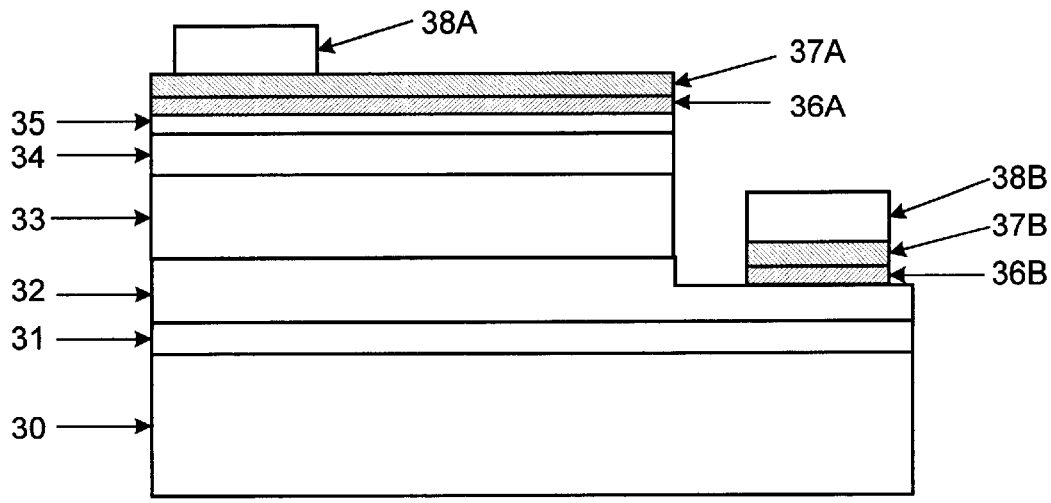
FIG. 3 schematically illustrates a cross-sectional view of an LED according to a first embodiment of the present invention.

FIG. 3 schematically illustrates a cross-sectional view of a first embodiment including a contact structure for a group III–V compound semiconductor LED. The contact structure may be used with other compound semiconductors such as group II–VI compound semiconductors. The device may be a photodiode (PD) or laser diode (LD), instead of a light emitting diode (LED), or another device known to those skilled in the art that utilizes luminescent compound semiconductor materials. The LED of FIG. 3 is fabricated on a substrate 30, which is preferably sapphire or another suitable insulator. The composition of the semiconductor layers may vary from layer to layer and satisfy the following formula: $Al_xGa_yIn_{1-x-y}N$, wherein $0<=x<=1$, $0<=y<=1$, and $0<=x+y<=1$ (referred to as AlGaInN hereafter). An AlGaInN buffer layer 31 is formed on the sapphire substrate 30 and a $n^+$-type AlGaInN cladding layer 32 is formed on the buffer layer 31 and has a thickness typically of 1–5 □m. An active AlGaInN based multiple quantum well structure (MQW) 33 is sandwiched between n-type cladding layer 32 and p-type AlGaInN cladding layer 34 with $p^+$-type AlGaInN layer 35 formed on top of cladding layer 34. The active layer 33 may alternatively be replaced with a heterojunction structure without departuring from the scope of this invention. Layer 36A forms the first layer of the contact structure. Layer 36A is a thin metal layer and is in direct contact with $p^+$-type AlGaInN layer 35, and layer 36B is also the first layer of the contact structure which is in direct contact with $n^+$-type AlGaInN layer 32. Layers 37A and 37B are transparent conducting oxide layers that are formed onto layers 36A and 36B, respectively. Layers 38A and 38B are metal contact pads formed onto the transparent conducting oxide layers 37A and 37B, respectively.

Now, alternative embodiments to the contact structure of the first embodiment, and a method of fabricating an LED in accord with the first embodiment are next explained.

First, each of the semiconductor layers from layer 31 through layer 35 are preferably formed on sapphire substrate 30 with conventional metal organic chemical vapor deposition (MOCVD or MOVPE) techniques. Alternatively, the semiconductor layers can be formed with other techniques such as conventional molecular beam epitaxy (MBE). Since substrate 30 is an insulator, electrical contact to the n-type side of the active layer 33 is made to $n^+$-type layer 32. Because layer 32 at this point is substantially completely covered with the semiconductor layers formed above it, photolithography patterning and etch techniques are employed to define and etch away a small portion of the layers 35, 34, 33 until a portion of layer 32 is exposed.

Next, thin metal layers 36A and 36B are preferably simultaneously formed on semiconductor device, wherein layer 36A is in direct contact to p+-type layer 35 and layer 36B is in direct contact with an exposed portion of $n^+$-layer 32. Thin metal layers 36A and 36B form the first layers of the contact structure. Contacts of layer 36A to p+-type layer 35 and of layer 36B to n+-type layer 32 are also preferably simultaneously formed according to this embodiment. The element or elements that make up each of layer 36A and layer 36B is/are preferably at least one of In, Sn, or Zn, and each of layer 36A and layer 36B has a preferred thickness in range approximately between 5 Angstroms and 400 Angstroms, and particularly between 20 Angstroms and 200 Angstroms, and more particularly between 40 Angstroms and 100 Angstroms. Alternatively, layer 36A and layer 36B may be formed with an alloy of In, Sn, and/or Zn by such techniques as thermal evaporation, e-beam evaporation, or sputtering.

Next, transparent conducting oxide layers 37A and 37B are formed on top of layers 36A and 36B, respectively. Transparent conducting oxide layers 37A and 37B form the second layers of the contact structures. Contacts of layer 37A to layer 36A and of layer 37B to layer 36B are preferably simultaneously formed according to this embodiment. The element or elements that make up each of layers 37A and 37B is/are at least one of Indium-Tin-Oxide (TO), Indium-Oxide ($In_2O_3$), Tin-Oxide ($SnO_2$), and Zinc-Oxide (ZnO), and each of layer 37A and layer 37B preferably has a thickness in an approximate range between 200 Angstroms and 50,000 Angstroms, and particularly between 500 Angstroms and 10,000 Angstroms, and more particularly between around 1000 Angstroms and 5000 Angstroms. Layer 37A and layer 37B may be formed by such techniques as thermal evaporation, e-beam evaporation, or sputtering.

Next, optional metal pad layers 38A and 38B are formed on top of layers 37A and 37B, respectively. Layer 38A and layer 38B are the optional third layers of the contact structure in this embodiment, and provide contact pads for wire-bonding pads or for other means of connecting the semiconductor device to external circuitry. Contacts of layer 38A to layer 37A and of layer 38B to layer 37B are preferably simultaneously formed in this embodiment. The element or elements of layer 38A and layer 38B is/are at least one of Al, Au, Cr, Mo, Ni, Pd, Pt, Rh, Ta, Ti and has a thickness range generally of 1000 Angstroms to 20,000 Angstroms, and preferably 2000 Angstroms to 10000 Angstroms. Layer 38A and layer 38B may be grown by means of thermal evaporation, e-beam evaporation, or sputtering.

Finally, a thermal anneal is carried out on the stacked layers of the contact structure. Thermal annealing is preferably performed under an atmosphere of nitrogen for period between a few seconds and around 60 minutes within a preferred temperature range of approximately 200° C. to 700° C. Alternatively, thermal annealing may be preferably performed under an atmosphere of air or oxygen or inert gases or in vacuum.

A preferred embodiment provides thermal anneal of the contact structure, which improves sheet resistance and optical transmission of the transparent conducting oxide layer. Additionally, a preferred embodiment of thermal anneal causes inter-diffusion and alloying of elements across the interface between semiconductor and the first layer of the contact structure, therefore further improving the contact resistance between the semiconductor and the contact layer. Furthermore, diffusion of interstitial oxygen from the transparent conducting oxide of the second layer of the contact structure into the first layer of the contact structure converts the remaining metallic element within the first layer into transparent conducting metal oxide, therefore enhance transmission of light generated in LED active layer.

Now still referring to FIG. 3, variations or alternatives of the contact structure of the first embodiment (specifically layers 36A and 37A) on $p^+$-type layer 35 are illustrated in the following description, wherein, by way of example, In is used for layer 36A and ITO is used for layer 37A.

The thickness of $p^+$-type layer 35 is generally between around 1000 and 5000 Angstroms and has orders of magnitude higher sheet resistance than the sheet resistance of the layers 36A and 37A (about 10 Ohms per square). Therefore, the contact layers 36A and 37A act as low-resistance current spreading layers to the entire LED active area. Optical transmission through transparent conducting oxide layer 37A is generally better than 90% for visible and near IR wavelengths of interest. Optical transmission of thin metal layer 36A depends on its thickness, and is semitransparent over a preferable thickness range. When the preferred thermal anneal, as described above, is performed on this plurality layered structure in a temperature range of 400–600° C., both the sheet resistance and the optical transmission of the transparent conducting oxide layer 37A are improved. Additionally, the thermal anneal causes some further In initially making up layer 36A to diffuse into p+-type layer 35, and interstitial oxygen in layer 37A diffuses into layer 36A. Since elemental In is compatible with AlGaInN based semiconductor layer 35, this inter-diffusion and alloying further improve (i.e., reduce) the contact resistance between layer 35 and layer 36A. Furthermore, simultaneous diffusion of interstitial oxygen from transparent conducting oxide layer 37A into In layer 36A converts the much of the remaining metallic In of layer 36A into conductive metal oxide, and in this preferred embodiment, $In_2O_3$, which is electrically conductive and optically transparent resulting in a highly transparent LED window (i.e., stack of layers 36A and 37A ) for improved high efficiency light extraction.

Next, the contact structure of layers 36B and 37B to $n^+$-type layer 32 is explained. It is first noted, however, that in a conventional LED contact structure, different metals are used for p+-type layer and $n^+$-type layer contacts, which requires at least one additional metal contact fabrication step. Therefore, an advantage of this embodiment is that the contact electrode to $n^+$-type layer 32 is made in the same fabrication step as the contact electrode to $p^+$-type layer 35. Since $n^+$-type AlGaInN generally is more conductive than $p^+$-type, low resistance contact to n+-type layer 32 is readily achieved. A thermal anneal of the contact structure also causes some further elemental In initially in layer 36B to diffuse into n+-type layer 32, and In is compatible with AlGaInN based semiconductor layer 32, such that this inter-diffusion and alloying further improve the reliability of the contact between layer 32 and layer 36B.

Alternatively, a thermal anneal treatment of the contact structure may be performed preferably under similar temperature, time, and environment conditions as stated above, but at a different contact formation step. In one of the embodiments, the contact structure is thermally annealed after formation of layers 37A and 37B, and prior to the formation of third optional metal pad layers 38A and 38B.

Still, in an another alternative embodiment, thermal anneal treatment of the contact structure may be performed, preferably under similar temperature, time, and environment conditions as stated above, after formation of layers 36A and 36B, and prior to the formation of layers 37A and 37B of the contact structure.

Figure 4:
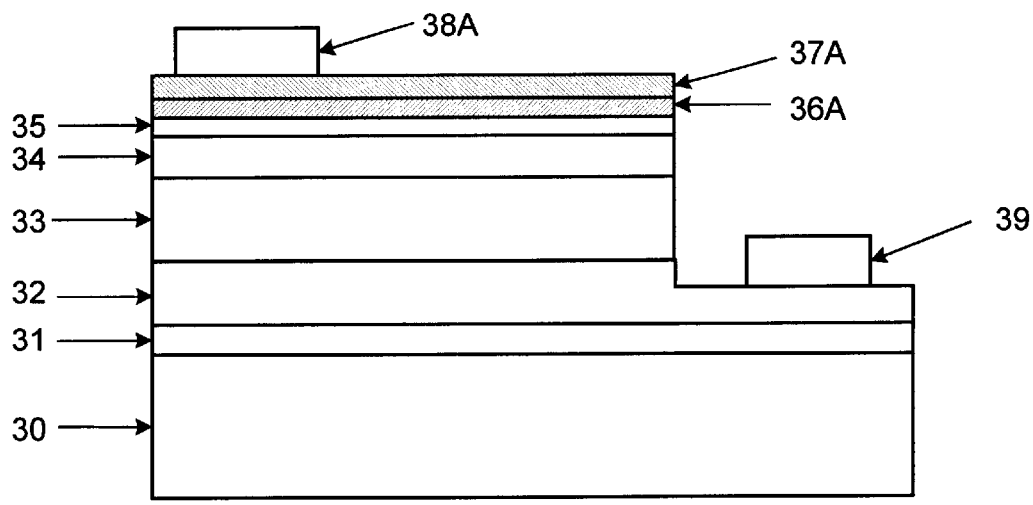
FIG. 4 schematically illustrates a cross-sectional view of an LED according to second embodiment of the present invention.

FIG. 4 schematically illustrates a cross-sectional view of an AlGaInN based LED according to a second embodiment. Note the layers that are preferably not changed in appearance from the structure of FIG. 3 are labeled with the same reference numerals. The structure of FIG. 4 differs from the structure of FIG. 3 in that contact layer 39 is used for contacting to n+-type layer 32. Layer 39 may be a layer that has the same structure as layer 38A, or it may be different from layer 38A. Furthermore, layer 39 may have a single layer structure or a plurality layer structure formed from the elements that are used for layer 38A. Layer 39 may be formed by means of thermal evaporation, e-beam evaporation, or sputtering.

Layer 36A is preferably made up of at least one of In, Sn, or Zn and has a thickness range preferably between 10 Angstroms and 400 Angstroms, and particularly between 20 Angstroms and 200 Angstroms, and more particularly between 40 Angstroms and 100 Angstroms. Alternatively, layer 36A may be formed with an alloy of In, Sn, and/or Zn. Layer 36A may be grown by means of thermal evaporation, e-beam evaporation, or sputtering.

Layer 37A is a transparent conducting oxide made up of preferably at least one of Indium-Tin-Oxide (ITO), Indium-Oxide ($In_2O_3$), Tin-Oxide ($SnO_2$), or Zinc-Oxide (ZnO) and has a thickness preferably in a range approximately between of 200 Angstroms and 50,000 Angstroms, and particularly between 500 Angstroms and 10,000 Angstroms, and more particularly between 1000 Angstroms and 5000 Angstroms. Layer 37A may be grown by means of thermal evaporation, e-beam evaporation, or sputtering.

The contact structure of the second embodiment schematically shown at FIG. 4 may be subjected to thermal annealing preferably under similar temperature, time, and environment conditions as described for the first embodiment of FIG. 3. A thermal anneal of the contact structure can be carried out after formation of layer 36A, and prior to formation of layer 37A, or after formation of layer 37A, and prior to formation of layer 38A, or after formation of layer 38A.

Now still referring to FIG. 4, alternatives and variations of the contact structure (layers 36A and 37A) to $p^+$-type layer 35 according to the second embodiment are described in detail below, wherein, by way of example, In is used for layer 36A and ITO is used for layer 37A.

The thickness of $p^+$-type layer 35 is generally between 1000 and 5000 Angstroms and has orders of magnitude higher sheet resistance than the sheet resistance of the layers 36A and 37A (about 10 Ohms per square). Therefore, the contact layers 36A and 37A act as low-resistance current spreading layers to the LED active region. Optical transmission of transparent conducting oxide layer 37A is generally better than 90% over visible and near IR wavelength of interest. Optical transmission of thin metal layer 36A depends on its thickness, and is semitransparent over the preferred thickness range. When a preferred thermal anneal is performed for this plurality layered structure at a preferred temperature range of 400–600° C., both sheet resistance and optical transmission of the transparent conducting oxide layer 37A are improved. Additionally, the thermal anneal causes some further elemental In initially of layer 36A to diffuse into p+-type layer 35, and interstitial oxygen initially of layer 37A diffuses into layer 36A. Since In is compatible with AlGaInN based semiconductor layer 35, this interdiffusion and alloying further improves (i.e., reduce) the contact resistance between layer 35 and layer 36A. Furthermore, interstitial oxygen from transparent conducting oxide layer 37A simultaneously diffuses into layer 36A and bonds to In atoms in layer 36A. This in turn converts metallic In of layer 36A into conductive metal oxide, and in this preferred embodiment, $In_2O_3$, which is electrically conductive and optically transparent resulting in a highly transparent LED window for improved high efficiency light extraction.

Figure 5:
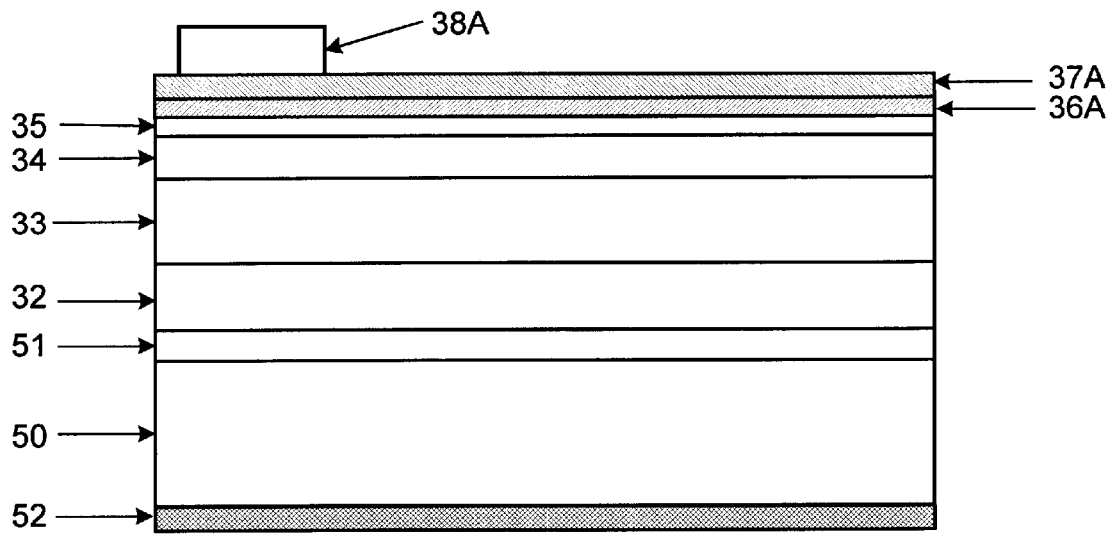
FIG. 5 shows a cross-sectional view of an LED according to a third embodiment of the present invention.

FIG. 5 schematically illustrates a contact structure according to a third embodiment of the present invention that achieves an improved efficiency, high brightness AlGaInN based LED. Note the layers that are not preferably changed from the structure of FIG. 3 are labeled with the same reference numerals. A difference from the structure of FIG. 3 is that a non-insulating and/or electrically conductive substrate 50, e.g., doped silicon-carbide, is used for the LED structure of FIG. 5. Advantageously, then, a two-sided contact configuration may be used to form the contact electrodes of the third embodiment. That is, the combination of layers 36A, 37A and 38A contacts $p^+$-type layer 35, and contact 52 to $n^+$-type layer 32 is made via substrate 50 and a n-type doped AlGaInN buffer layer 51. The substrate 50 may be a n-type doped silicon-carbide crystalline substrate. Layer 52 can have the same structure as layer 38A, or it may be a layer that is different from layer 38A. Furthermore, layer 52 can have a single layer structure or a plurality layer structure preferably formed from one or more of the elements that are used for layer 38A. Layer 52 can be in direct contact with the entire area of the substrate 50 back surface, or it can be in contact with a smaller portion of the substrate 50 back surface. Layer 52 can be formed by means of physical vapor deposition, such as thermal evaporation, e-beam evaporation, or sputtering.

The semiconductor layer 51 and layers 32 through 35 are preferably formed on substrate 50 using metal organic chemical vapor deposition (MOCVD or MOVPE) techniques. Alternatively, these semiconductor layers may be formed with such techniques as molecular beam epitaxy (MBE).

Layer 36A is preferably made up of at least one of In, Sn, or Zn and has a preferred thickness in a range between 10 Angstroms and 400 Angstroms, and particularly between 20 Angstroms and 200 Angstroms, and more particularly between 40 Angstroms and 100 Angstroms. Alternatively, layer 36A may be formed with an alloy of In, Sn, and Zn. Layer 36A may be grown by means of thermal evaporation, e-beam evaporation, or sputtering.

Layer 37A is preferably made up of at least one of Indium-Tin-Oxide (ITO), Indium-Oxide ($In_2O_3$), Tin-Oxide ($SnO_2$), or Zinc-Oxide (ZnO) and has a preferred thickness in a range between 200 Angstroms and 50,000 Angstroms, and particularly between 500 Angstroms and 10,000 Angstroms, and more particularly between 1000 Angstroms and 5000 Angstroms. Layer 37A may be grown by means of thermal evaporation, e-beam evaporation, or sputtering.

The contact structure of the third embodiment may undergo a thermal anneal which may be performed preferably under similar temperature, time, and environment conditions as described in the first embodiment with respect to the structure shown at FIG. 3. Thermal annealing of the contact structure can be carried out after formation of layer 36A, and prior to formation of layer 37A, or after formation of layer 37A, and prior to formation of layer 38A, or after formation of layer 38A.

Now still referring to FIG. 5, the contact structure (layers 36A and 37A) to p+-type layer 35 is described in further detail in the following exemplary embodiments, wherein In is used for layer 36A and ITO is used for layer 37A.

The thickness of p+-type layer 35 is generally in a range between 1000 to 5000 Angstroms and has orders of magnitude higher sheet resistance than the sheet resistance of layers 36A and 37A (about 10 Ohms per square). Therefore, contact layers 36A and 37A act as low-resistance current spreading layers to the LED active region. Optical transmission of transparent conducting oxide layer 37A is generally better than 90% over visible and near IR wavelengths of interest. Optical transmission of thin metal layer 36A depends on its thickness, and is semitransparent over a preferable thickness range. When a preferred thermal anneal is performed for this plurality layer structure at a temperature range of 400–600° C., both sheet resistance and optical transmission of the transparent conducting oxide layer 37A are improved. Additionally, the thermal anneal causes some further In initially in layer 36A to diffuse into p+-type layer 35, and interstitial oxygen in layer 37A to diffuse into layer 36A. Since In is compatible with AlGaInN based semiconductor layer 35, this inter-diffusion and alloying further improve (i.e., reduce) the contact resistance between layers 35 and 36A. Furthermore, simultaneous diffusion of interstitial oxygen from transparent conducting oxide layer 37A into In layer 36A converts metallic In of layer 36A into conductive metal oxide, and in a preferred embodiment, $In_2O_3$, which is electrically conductive and optically transparent, therefore resulting in a highly transparent window for improved LED light extraction.

Figure 6:
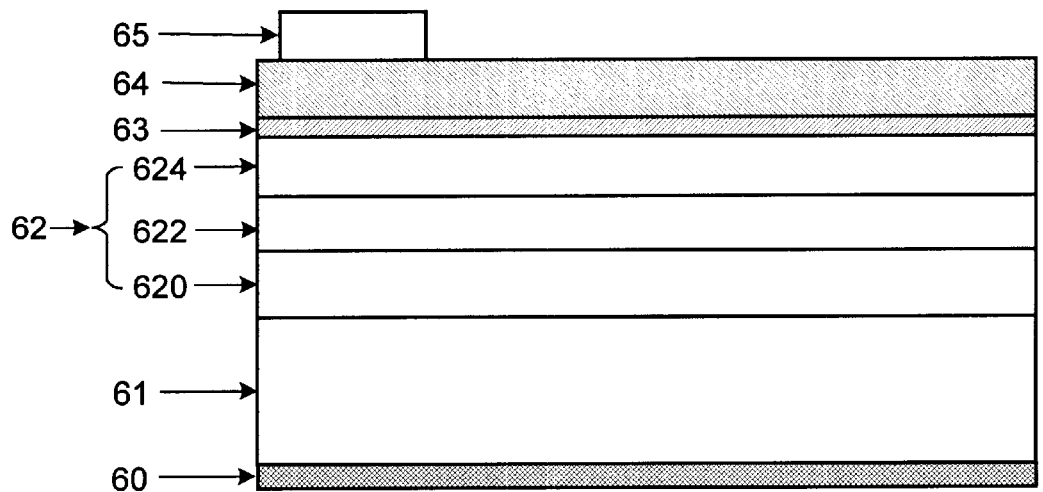
FIG. 6 shows a cross-sectional view of an LED according to a fourth embodiment of the present invention.

FIG. 6 illustrates a cross-section view of fourth preferred LED structure having a contact structure in accord with the present invention. The composition of the semiconductor layers may vary from layer to layer within the LED and satisfy the following formula: $Al_xGa_yIn_{1-x-y}As_zP_{1-z}$, wherein 0<=x<=1, 0<=y<=1, 0<=x+y<=1, 0<=z<=1 inclusive (referred to as AlGaInAsP hereafter). For this LED, layer 60 is a back electrode to n-type AlGaInAsP substrate 61. A stacked structure of AlGaInAsP 62 is an active p-n junction which includes a lower n-type AlGaInAsP cladding layer 620, an active AlGaInAsP layer 622, and an top p-type AlGaInAsP cladding layer 624. Alternatively, the active layer 622 can have a MQW structure. Layer 63 forms the first layer of the contact structure and is a preferably a thin metal layer that is in direct contact with p-type AlGaInAsP cladding layer 624. Layer 64 forms the second layer of the contact structure of the fourth embodiment and is a transparent conducting oxide. Layer 65 is an optional metal contact pad formed onto the transparent conducting oxide layer 64.

Layer 63 is preferably made up of at least one of In, Sn, or Zn and has a preferred thickness between about 10 Angstroms and 400 Angstroms, and particularly between 20 Angstroms and 200 Angstroms, and more particularly between 40 Angstroms and 100 Angstroms. Alternatively, layer 63 may be formed with an alloy of In, Sn, and/or Zn. Layer 63 may be grown by means of thermal evaporation, e-beam evaporation, or sputtering.

Layer 64 is preferably made up of at least one of Indium-Tin-Oxide (ITO), Indium-Oxide ($In_2O_3$), Tin-Oxide ($SnO_2$), or Zinc-Oxide (ZnO) and has a preferred thickness in a range between 200 Angstroms and 50,000 Angstroms, and particularly between 500 Angstroms and 10,000 Angstroms, and more particularly between 1000 Angstroms and 5000 Angstroms. Layer 64 may be grown by means of thermal evaporation, e-beam evaporation, or sputtering.

The contact structure of the fourth embodiment may be subjected to a thermal anneal process that may be performed preferably under similar temperature, time, and environment conditions as described in the first embodiment shown at FIG. 3, and preferably, in a temperature range between 300° C. and 500° C. Thermal annealing of the contact structure can be carried out after formation of layer 63 and prior to formation of layer 64, or after formation of layer 64 and prior to formation of layer 65, or after formation of layer 65.

Now still referring to FIG. 6, the contact structure (layer 63 and layer 64) to the p-type cladding layer 624 is described in further detail in the following exemplary embodiment, wherein In is used for layer 63 and ITO is used for layer 64.

The p-type layer 624 generally has a thickness between around 1000 and 5000 Angstroms and has orders of magnitude higher sheet resistance than the sheet resistance of the layers 63 and 64 (about 10 Ohms per square). Therefore, the contact layers 63 and 64 act as low-resistance current spreading layers to the LED active region. Optical transmission of transparent conducting oxide layer 64 is generally better than 90% over visible and: near IR wavelengths of interest. Optical transmission of thin metal layer 63 depends on its thickness, and is semitransparent over a preferred thickness range. When a preferred thermal anneal is performed for this plurality layer structure within a preferred temperature range of 300° C.–500° C., both sheet resistance and optical transmission of the transparent conducting oxide layer 64 are improved. Additionally, the thermal anneal causes some further In initially of layer 63 to diffuse into p+-type layer 624, and interstitial oxygen in layer 64 to diffuse into layer 63. Since In is compatible with AlGaInP based semiconductor layer 624, this inter-diffusion and alloying further improve (i.e., reduce) the contact resistance between layer 63 and layer 624. Also, preferably simultaneous diffusion of interstitial oxygen from transparent conducting oxide layer 64 into In layer 63 converts metallic In of layer 63 into conductive metal oxide, and in this preferred embodiment, $In_2O_3$, which is electrically conductive and optically transparent, therefore resulting in a highly transparent window for improved LED light extraction.

Figure 7:
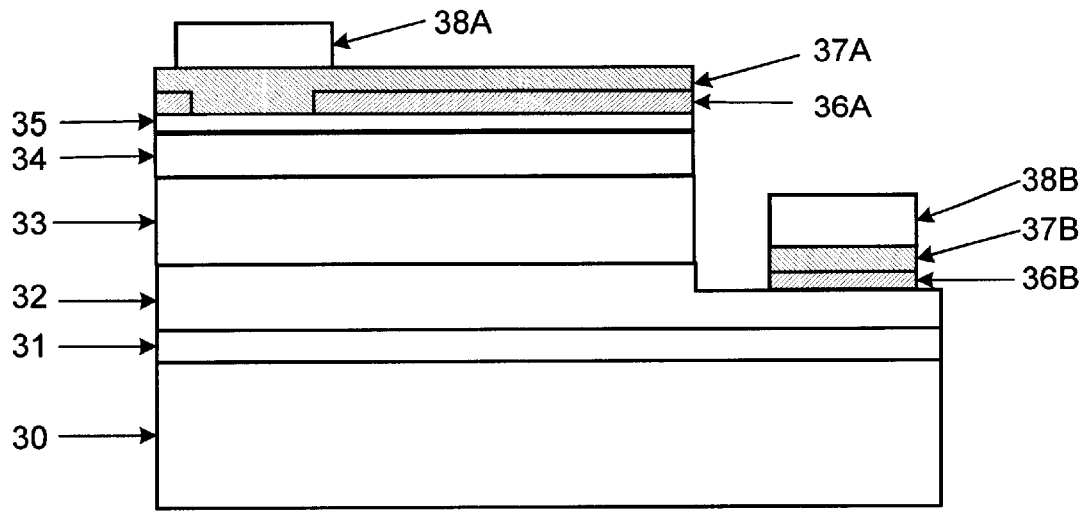
FIG. 7 schematically illustrates a cross-sectional view of an LED according to a fifth embodiment of the present invention.

FIGS. 7–10 illustrate additional alternative embodiments in accord with the present invention. FIG. 7 schematically illustrates a fifth embodiment which is similar to the first embodiment shown at FIG. 3, wherein a difference resides in a small portion of conduction layer 36A being removed so that transparent conducting oxide layer 37A forms a blocking (Schottky barrier) contact directly to the portion of p+-type layer 35 under the contact pad 38A, therefore reducing the current injection to the active region directly underneath the contact pads 38A, and effectively increasing the current injection density into the rest of the active region with help from the improved sheet resistance contact structure of layers 36A and 37A (which together act as a current spreading layer). It may be advantageous to reduce the current injection into the portion of the active region directly underneath the contact pad 38A, because the light generated in this area will be substantially blocked by the contact pad 38A and thus not transmitted outside the device.

Figure 8:
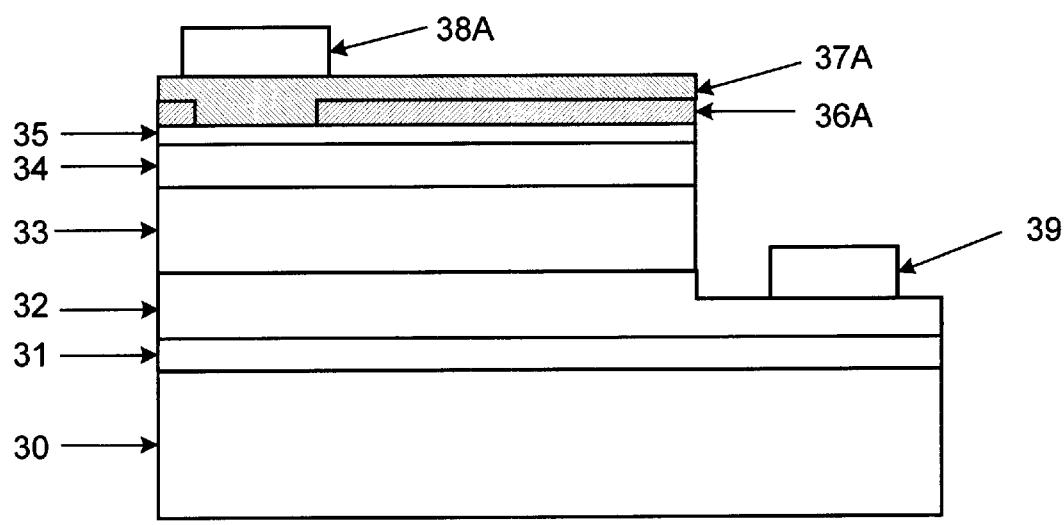
FIG. 8 schematically illustrates a cross-sectional view of an LED according to sixth embodiment of the present invention.

FIG. 8 schematically illustrates a sixth embodiment which is similar to the second embodiment shown at FIG. 4, wherein a difference resides in a small portion of conduction layer 36A being removed so that transparent conducting oxide layer 37A forms a blocking (Schottky barrier) contact directly to the portion of p+-type layer 35 under the contact pad 38A, therefore reducing the current injection to the active region directly underneath the contact pads 38A, and effectively increasing the current injection density into the rest of the active region with help from the improved sheet resistance contact structure of layers 36A and 37A (which together act as a current spreading layer). It may be advantageous to reduce the current injection into the portion of active region directly underneath the contact pad 38A, because the light generated in this area will be substantially blocked by the contact pad 38A and thus will not transmit outside the device.

Figure 9:
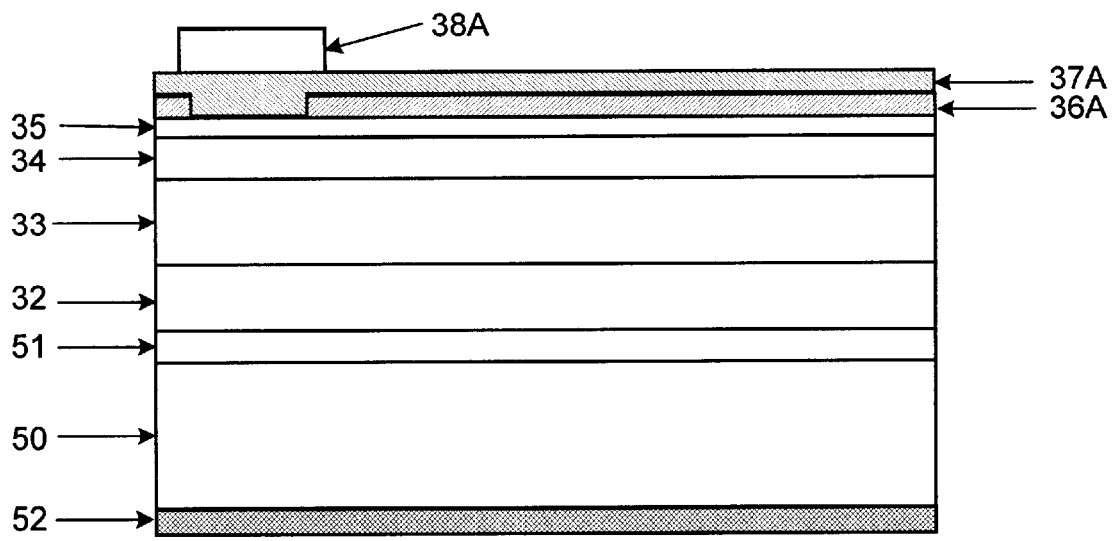
FIG. 9 shows a cross-sectional view of an LED according to a seventh embodiment of the present invention.

FIG. 9 schematically illustrates a seventh embodiment which is similar to the third embodiment shown at FIG. 5, wherein a difference resides in a small portion of conduction layer 36A being removed so that transparent conducting oxide layer 37A forms a blocking (Schottky barrier) contact directly to the portion of p+-type layer 35 under the contact pad 38A, therefore reducing the current injection to the active region directly underneath the contact pads 38A, and effectively increasing the current injection density into the rest of the active area with help from the improved sheet resistance contact structure of layers 36A and 37A (which together act as a current spreading layer). It may be advantageous to reduce the current injection into the portion of active region directly underneath the contact pad 38A, because the light generated in this area will be substantially blocked by the contact pad 38A and thus will not transmit outside the device.

Figure 10:
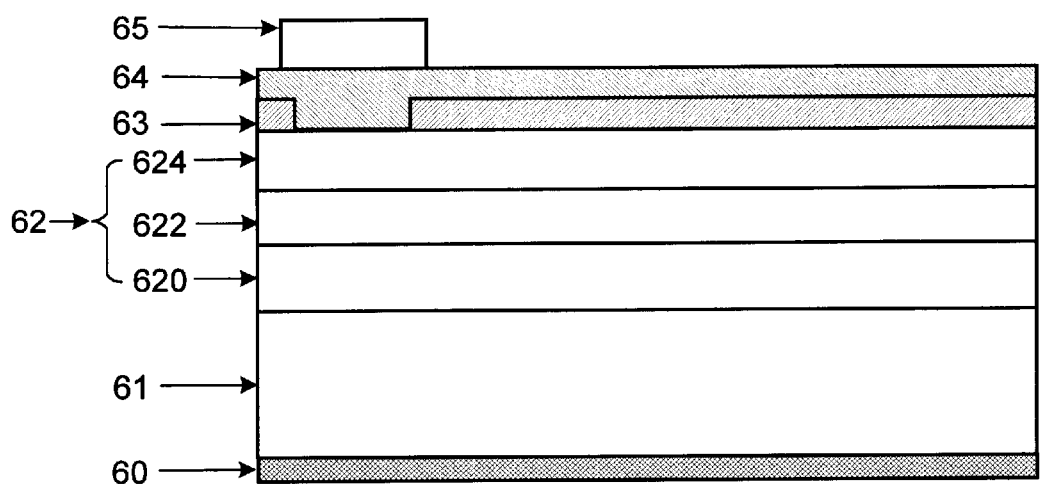
FIG. 10 shows a cross-sectional view of an LED according to a eighth embodiment of the present invention.

FIG. 10 schematically illustrates an eighth embodiment which is similar to the fourth embodiment shown at FIG. 6, wherein a difference resides in a small portion of conduction layer 36A being removed so that transparent conducting oxide layer 64 forms a blocking (Schottky barrier) contact directly to the portion of p+-type layer 624 under the contact pad 65, therefore reducing the current injection to the active region directly underneath the contact pads 65, and effectively increases the current injection density into the rest of the active region with help from the improved sheet resistance contact structure of layers 63 and 64 (which together act as a current spreading layer). It may be advantageous to reduce the current injection into the portion of active region directly underneath the contact pad 38A, because the light generated in this area will be substantially blocked by the contact pad 38A and thus will not transmit outside the device.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the steps have been ordered in selected typographical sequences. However, the sequences have been selected and so ordered for typographical convenience and are not intended to imply any particular order for performing the steps, except for those claims wherein a particular ordering of steps is expressly set forth or understood by one of ordinary skill in the art as being necessary. For example, where a second layer is recited as being formed over a first layer, it is understood that the first layer is formed in the device before the second layer. As another example, the annealing step, as also described above, may be performed after formation of the first contact layer of metal and before formation of the second contact layer of transparent conducting oxide, or after formation of the second contact layer of transparent conducting oxide layer and before formation of the metal pad, or after formation of the metal pad, notwithstanding the typographical position of the annealing step in the claims. However, in those claims where it is specifically recited that the annealing is performed either after formation of the first contact layer of metal and before formation of the second contact layer of transparent conducting oxide, or after formation of the second contact layer of transparent conducting oxide layer and before formation of the metal pad, or after formation of the metal pad, then it is meant in those claims that the annealing step be performed at that particular position with respect to the other steps in the process.

What is claimed is:

1. A contact structure for a compound semiconductor device having p-type or n-type conduction, comprising:
   a first plurality layer structure having at least a first contact layer of metal selected from the group consisting of Indium, Tin, Zinc and alloys thereof contacting a group III–V compound semiconductor and a second contact layer of transparent conducting oxide selected from the group consisting of Indium-Tin-Oxide, Indium-Oxide, Tin-Oxide and Zinc-Oxide being formed on said first contact layer; and
   a second layer structure including a metal pad formed on said first plurality layer structure.

2. A contact structure according to claim 1, wherein said first plurality layer structure has undergone a thermal anneal at an elevated temperature.

3. A contact structure according to claim 2, wherein said thermal anneal was performed in a temperature range between about 200° C. and 700° C.

4. A contact structure according to claim 2, wherein said thermal anneal was performed under in an atmosphere including at least one gaseous species selected from the group of gaseous species consisting of air, nitrogen, oxygen, argon, and helium.

5. A contact structure according to claim 1, wherein said metal pad of said second layer structure comprises at least one element selected from the group of elements consisting of Aluminum (Al), Gold (Au), Chromium (Cr), Molybdenum (Mo), Nickel (Ni), Palladium (Pd), Platinum (Pt), Rhodium (Rh), Tantalum (Ta), and Titanium (Ti).

6. A contact structure according to claim 1, wherein said first contact layer of said first plurality layer structure comprises Indium, and said second contact layer of transparent conducting oxide of said first plurality layer structure comprises Indium-Tin-oxide (ITO).

7. A contact structure according to claim 1, wherein said first contact layer of said first plurality structure comprises Indium, and said second contact layer of transparent conducting oxide of said first plurality structure comprises Indium-oxide ($In_2O_3$).

8. A contact structure according to claim 1, wherein said first contact layer of said first plurality structure comprises Indium, and said second contact layer of transparent conducting oxide of said first plurality structure comprises Tin-oxide ($SnO_2$).

9. A contact structure according to claim 1, wherein said first contact layer of said first plurality layer structure comprises tin, and said second contact layer of transparent conducting oxide of said first plurality layer structure comprises Indium-Tin-oxide (ITO).

10. A contact structure for a compound semiconductor device having p-type or n-type conduction, comprising:
    a first plurality layer structure having at least a first contact layer of metal contacting a group III–V compound semiconductor and a second contact layer of transparent conducting oxide being formed on said first contact layer; and a second layer structure including a metal pad formed on said first plurality layer structure, wherein said first contact layer of said first plurality structure comprises tin, and said second contact layer of transparent conducting oxide of said first plurality structure comprises Indium-oxide ($In_2O_3$).

11. A contact structure for a compound semiconductor device having p-type or n-type conduction, comprising:

a first plurality layer structure having at least a first contact layer of metal contacting a group III–V compound semiconductor and a second contact layer of transparent conducting oxide being formed on said first contact layer; and a second layer structure including a metal pad formed on said first plurality layer structure, wherein said first contact layer of said first plurality structure comprises tin, and said second contact layer of transparent conducting oxide of said first plurality structure comprises Tin-oxide ($SnO_2$).

12. A contact structure for a compound semiconductor device having p-type or n-type conduction, comprising:

a first plurality layer structure having at least a first contact layer of metal contacting a group III–V compound semiconductor and a second contact layer of transparent conducting oxide being formed on said first contact layer; and a second layer structure including a metal pad formed on said first plurality layer structure, wherein said first contact layer of said first plurality layer structure comprises zinc, and said second contact layer of transparent conducting oxide of said first plurality layer structure comprises Indium-Tin-oxide (ITO).

13. A contact structure for a compound semiconductor device having p-type or n-type conduction, comprising:

a first plurality layer structure having at least a first contact layer of metal contacting a group III–V compound semiconductor and a second contact layer of transparent conducting oxide being formed on said first contact layer; and a second layer structure including a metal pad formed on said first plurality layer structure, wherein said first contact layer of said first plurality structure comprises zinc, and said second contact layer of transparent conducting oxide of said first plurality structure comprises Indium-oxide ($In_2O_3$).

14. A contact structure for a compound semiconductor device having p-type or n-type conduction, comprising:

a first plurality layer structure having at least a first contact layer of metal contacting a group III–V compound semiconductor and a second contact layer of transparent conducting oxide being formed on said first contact layer; and a second layer structure including a metal pad formed on said first plurality layer structure, wherein said first contact layer of said first plurality structure comprises zinc, and said second contact layer of transparent conducting oxide of said first plurality structure comprises Tin-oxide ($SnO_2$).

15. A contact structure according to claims 6–14, wherein said first plurality layer structure has undergone a thermal anneal at an elevated temperature, and wherein said thermal anneal is performed in a temperature range from about 200° C. to 700° C.

16. A contact structure according to claim 1, wherein said first contact layer of said first plurality structure has a thickness in a range between about 5 Angstroms and 1000 Angstroms.

17. A contact structure according to claim 16, wherein said second contact layer of transparent conducting oxide of said first plurality structure has a thickness in a range between about 100 Angstroms and 50,000 Angstroms.

18. A contact structure according to claim 17, wherein said metal pad of said second layer structure has a thickness in a range between about 100 Angstroms and 50,000 Angstroms.

19. A contact structure according to claim 1, wherein said second contact layer of transparent conducting oxide of said first plurality structure has a thickness in a range between about 100 Angstroms and 50,000 Angstroms.

20. A contact structure according to claim 1, wherein said metal pad of said second layer structure has a thickness in a range between about 100 Angstroms and 50,000 Angstroms.

21. A contact structure according to claim 5, wherein said metal pad of said second layer structure has a thickness in a range between about 100 Angstroms and 50,000 Angstroms.

22. A contact structure according to claim 5, wherein said metal pad of said second layer structure is configured for connection with electronic circuitry by a method selected from the group of methods consisting of wire-bonding and anisotropic conductive film bonding.

23. A contact structure as in any of claims 3 or 6–14, wherein said thermal anneal was performed in an atmosphere of nitrogen.

24. A contact structure according to any of claims 3 or 6–14, wherein said thermal anneal was performed in an atmosphere of air.

25. A contact structure according to any of claims 3 or 6–14, wherein said thermal anneal was performed in an atmosphere of oxygen.

26. A contact structure according to claims 3 or 6–14, wherein said thermal anneal was performed in an evacuated atmosphere.

27. A contact structure according to any of claims 8, 11 or 14, wherein said second contact layer of transparent conducting oxide further comprises indium-tin-oxide.

28. A group III–V compound semiconductor device having contact structure as in claim 1 further comprising:

a substrate; and a group III–V semiconductor plurality layer structure formed on said substrate, wherein said contact structure is formed on said group III–V semiconductor plurality layer structure.

29. A semiconductor device as in claim 28, wherein said group III–V semiconductor layers comprise $Al_xGa_yIn_{1-x-y}N$, where $0<=x<=1$, $0<=y<=1$, and $0<=x+y<=1$ inclusive.

30. A semiconductor device of claim 29, wherein said group III–V compound semiconductor device is a device selected from the group of devices consisting of a light-emitting diode (LED), a laser diode (LD), and a photodiode (PD).

31. A semiconductor device as in claim 28, wherein said group III–V semiconductor plurality layer structure comprises $Al_xGa_yIn_{1-x-y}As_zP_{1-z}$, wherein $0<=x<=1$, $0<=y<=1$, $0<=x+y<=1$, $0<=z<=1$ inclusive.

32. A semiconductor device as in claim 31, wherein said group III–V compound semiconductor device is a device selected from the group of devices consisting of a light emitting diode (LED), a laser diode (LD) and a photodiode (PD).

33. A semiconductor device as in claim 28, wherein said substrate comprises an insulator.

34. A semiconductor device as in claim 33, wherein said insulator comprises sapphire.

35. A semiconductor device as in claims 34, wherein said non-insulating material comprises doped silicon-carbide.

36. A group II–VI compound semiconductor device having contact structure as in claim 1, and further comprising:
   a substrate; and
   a group II–VI semiconductor plurality layer structure formed on said substrate,
   wherein said contact structure is formed on said group II–VI semiconductor plurality layer structure.

37. A contact electrode for a compound semiconductor device having an active region and at least one of a p+-conduction layer and a n+-conduction layer, comprising:
   a thin annealed metal layer with a small portion removed over one of said at least one of said p+-conduction layer and said n+-conduction layer of said device, said thin metal layer being partially inter-diffused in said conduction layer;
   a transparent conducting oxide layer selected from the group consisting of Indium-Oxide, Tin-Oxide and Zinc-Oxide over said thin annealed metal layer and over said small portion of said conduction layer and having said thin annealed metal layer partially inter-diffused therein, said transparent conducting oxide layer over said thin annealed metal layer for spreading current over a wider active region than a metal pad over said transparent conducting oxide layer, said transparent conducting oxide layer over said small portion of said conduction layer and creating Schottky barrier with said conduction layer for current blocking, thereby reducing the current flow into said small portion of said conduction layer and increasing the light output of the device; and
   said metal pad contact over a fractional portion of said transparent conducting oxide layer which at least partially overlaps an area including where said small portion of said thin metal contact layer was removed, wherein the thin annealed metal layer is selected from the group consisting of Indium, Tin, Zinc and alloys thereof.

38. The contact structure of claim 1, wherein the first contact layer comprises a plurality layer structure of at least two elements.

39. The contact structure of claim 38, wherein the first contact layer has undergone a thermal anneal between depositions of the at least two elements.

40. The contact structure of claim 39, wherein said at least two elements include nickel over indium.

41. The contact structure of claim 39, wherein said at least two elements include indium over nickel.

42. The contact structure of claim 38, wherein the first contac layer has undergone a thermal anneal after deposition of the at least two elements.

43. The contact structure of claim 42, wherein said at least two elements include nickel over indium.

44. The contact structure of claim 42, wherein said at least two elements include indium over nickel.

45. The contact structure of claim 1, wherein the first contact layer comprises an alloy of the at least two elements.

46. The contact structure of claim 45, wherein the at least two elements include nickel and indium.

47. The contact structure of claim 45, wherein said plurality layer structure has undergone a thermal anneal at an elevated temperature.

48. The contact structure of claim 47, wherein the at least two elements include nickel and indium.

49. A contact electrode for a compound semiconductor device having an active region and at least one of a p+-conduction layer and a n+ conduction layer, comprising:
   a thin annealed metal layer comprising Indium over one of said at least one of said p+-conduction layer and said n+-conduction layer of said device, said thin metal layer being partially inter-diffused in said one of said at least one of said p+ conduction layer and said n+-conduction layer;
   a transparent conducting oxide layer over said thin annealed metal layer and having said thin annealed metal layer partially inter-diffused therein, said transparent conducting oxide layer over said thin annealed metal layer for spreading current over a wider active region than a metal pad contact over said transparent conducting oxide layer;
   said metal pad contact over a fractional portion of said transparent conducting oxide layer.

50. The contact electrode of claim 49, wherein the transparent conducting oxide layer is selected from the group consisting of Indium-Tin-Oxide, Indium-Oxide, Tin-Oxide and Zinc-Oxide.

51. The contact electrode of claim 49, wherein the transparent conducting oxide layer comprises Indium-Tin-Oxide.

52. The contact electrode of claim 51, wherein the thin annealed metal layer further comprises at least one from the group consisting of nickel, chromium, tin, zinc and alloys of nickel, chromium, tin, zinc and indium.

53. The contact electrode of claim 49, wherein the thin annealed metal layer further comprises at least one from the group consisting of nickel, chromium, tin, zinc and alloys of nickel, chromium, tin, zinc and indium.

54. A semiconductor device as in claim 28, wherein said substrate comprises a non-insulating material.

* * * * *